United States Patent
Goko

(10) Patent No.: US 7,284,217 B2
(45) Date of Patent: Oct. 16, 2007

(54) METHOD OF LSI DESIGNING AND A COMPUTER PROGRAM FOR DESIGNING LSIS

(75) Inventor: Hiroki Goko, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 334 days.

(21) Appl. No.: 10/993,490

(22) Filed: Nov. 22, 2004

(65) Prior Publication Data

US 2005/0289492 A1    Dec. 29, 2005

(30) Foreign Application Priority Data

Jun. 29, 2004   (JP)   ............................. 2004-190990

(51) Int. Cl.
    *G06F 17/50*   (2006.01)
(52) U.S. Cl. ...................... 716/6; 716/4; 716/5; 716/10
(58) Field of Classification Search .................... 716/6, 716/5, 4, 1, 10
    See application file for complete search history.

(56) References Cited

U.S. PATENT DOCUMENTS

| | | | | |
|---|---|---|---|---|
| 5,452,239 A | * | 9/1995 | Dai et al. | 703/19 |
| 5,956,257 A | * | 9/1999 | Ginetti et al. | 716/3 |
| 6,218,861 B1 | * | 4/2001 | Sudo et al. | 326/46 |
| 6,609,241 B2 | | 8/2003 | Yonemori | |

* cited by examiner

*Primary Examiner*—Sun James Lin
(74) *Attorney, Agent, or Firm*—Volentine & Whitt, P.L.L.C.

(57) ABSTRACT

An LSI designing method using one or more functional blocks each containing two or more flip flops, includes the following: preparing a timing model which can be used under a first mode and a second mode; performing functional design of some functional elements each of which includes one or more functional blocks; carrying out logic composition with respect to the functional elements decided by the functional design using the timing model of the functional blocks under the first mode; performing a first timing analysis with respect to the functional elements on which logic composition was carried out using the timing model under the first mode; performing layout based on the result of the logic composition and the first timing analysis; and performing a second timing analysis after the layout using the timing model under the second mode.

3 Claims, 5 Drawing Sheets

METHOD OF LSI DESIGNING AND A COMPUTER PROGRAM FOR DESIGNING LSIS

BACKGROUND OF THE INVENTION

1. Field of the Invention

The present invention generally relates to a timing model. More specifically, the present invention relates to a timing model of a functional block and a method of LSI (large scale semiconductor integrated circuit) designing using the timing model.

2. Background Information

In the field of LSI systems and related devices, a method of turning a core functional block of an LSI into a module and recycling the functional block has become typical in recent years. This method has been pursued as a measure to shorten the length of time for designing an LSI and to improve productivity.

As an example of the conventional art, Japanese Patent No. 3420195, which is hereby incorporated by reference, discloses a method of LSI designing, in particular, a method of LSI layout designing using a module.

In the LSI designing using a module, logic composition, timing verification, etc. are performed using a timing model in which the timing information inside the module is incorporated. This timing information is made of input setup time, input hold time, and output delay time inside the module. In the definition of each time, clock delay time inside the module is already included. Furthermore, in the process of logic composition, pre-layout timing verification, and post-layout timing verification, the same timing model is used.

In the usual LSI designing, logic composition is performed under so-called ideal clock conditions where the delay time of a clock is assumed to be zero. However, in the timing model of the module, the propagation clock conditions which contained internal clock delay time are already defined. Therefore, when designing a higher rank class using the module, the difference between the ideal clock conditions of this higher rank class and the propagation clock conditions inside the module influences the timing restrictions greatly. For this reason, it is difficult to design an LSI with a desired performance. Then, in the logic composition, it is necessary to use another timing model set as the ideal clock conditions where the clock delay time inside the module is disregarded. This is also the same in the case of pre-layout timing verification.

On the other hand, in post-layout timing verification, i.e. the timing analysis performed after physical layout is completed, the timing model of the propagation clock conditions containing the clock delay time is needed.

However, under the present circumstances, since the timing model which fulfills ideal clock conditions and propagation clock conditions simultaneously does not exist, it is necessary to prepare two kinds of timing models according to a design step. For this reason, the design environment tends to become complicated. Moreover, there is a possibility that design efficiency might decline. In addition, Japanese Patent No. 3420195 does not indicate any designing method of LSI for solving such a problem.

In view of the above, it will be apparent to those skilled in the art from this disclosure that there exists a need for an improved method of LSI designing and a computer program for designing LSIs. This invention addresses this need in the art as well as other needs, which will become apparent to those skilled in the art from this disclosure.

SUMMARY OF THE INVENTION

It is therefore an object of the present invention to resolve the above-described problem, and to provide a simple and efficient timing model and a method of LSI designing which requires one kind of timing model.

In accordance with a first aspect of the present invention, an LSI designing method is provided using one or more functional blocks each of which contains two or more flip flops. This LSI designing method includes the steps of: preparing a timing model which can be used under a first mode and a second mode; performing functional design of some functional elements each of which includes one or more functional blocks; with respect to the functional elements obtained by the functional design, carrying out logic composition using the timing model of the functional blocks under the first mode; with respect to the functional elements on which logic composition of the timing model of a functional block was carried out, performing a first timing analysis using the timing model under the first mode; performing layout based on the result of the logic composition and the first timing analysis; and after the layout, performing a second timing analysis using the timing model under the second mode.

In accordance with a second aspect of the present invention, a computer program is provided to operate a computer to design an LSI using a timing model with respect to functional blocks. The computer program for designing an LSI includes the processes of: setting input setup time inside the functional block; setting input hold time inside the functional block; setting output delay time inside the functional block; and setting clock delay time inside the functional block independently of the other three settings.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
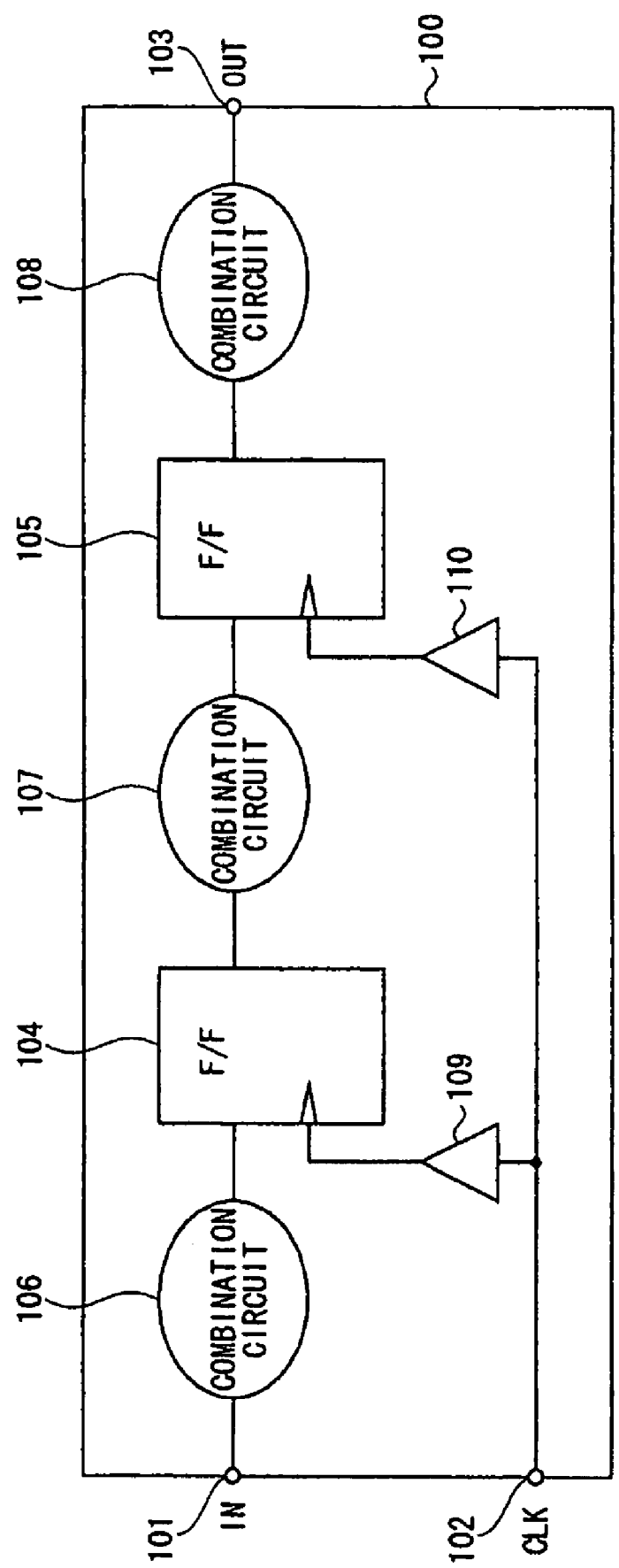
FIG. 1 is a schematic view of a functional block (module) 100 according to first, second, and third preferred embodiments of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

First, a first embodiment of the present invention will be described referring to the drawings.

Module Composition

FIG. 1 is a schematic view of a functional block (module) 100 according to the first embodiment of the present invention. The module 100 is equipped with a data input terminal (IN) 101, a clock input terminal (CLK) 102, and a data output terminal (OUT) 103 as external points of contact. Inside the module 100, flip flops (F/F) 104 and 105 which operate on the basis of a clock, and combination circuits 106 to 108, which do not require the clock, are provided. In order to adjust the difference (clock skew) in clock delay, a buffer 109 is arranged between the CLK 102 and the F/F 104, and a buffer 110 is arranged between the CLK102 and the F/F 105.

Timing Model

The timing model of the module 100 incorporates timing information which is made of IN setup time T201, IN hold time T202, and OUT delay time T203. The IN setup time T201, IN hold time T202, and OUT delay time T203 are based on a clock inputted from the CLK 102. In the following, concrete calculation formulae of T201, T202, and T203 are shown. In the following formulae, T204 is the F/F 104 setup time, T205 is the combination circuit 106 delay time, T206 is the F/F 104 clock delay time, T207 is the F/F 104 hold time, T208 is the F/F 105 delay time, T209 is the combination circuit 108 delay time, and T210 is the F/F 105 clock delay time.

$$T201 = T204 + T205 - T206 \quad (1)$$

$$T202 = T207 - T205 + T206 \quad (2)$$

$$T203 = T208 + T209 + T210 \quad (3)$$

Referring to FIG. 1 and formula (1), the IN setup time (T201) of the module 100 is determined only by the time relevant to the F/F 104, which is the first F/F from the IN 101, and the combination circuit 106 located between the IN 101 and F/F 104. Likewise, the IN hold time (T202) of the module 100 is determined only by the time relevant to the F/F 104 and the combination circuit 106. The OUT delay time (T203) of the module 100 is determined only by the time relevant to the F/F 105 which is the last F/F from the IN 101, and the combination circuit 108 located between the F/F 105 and the OUT 103. Not only the example of the module 100 shown in FIG. 1, but also in general terms, the circuits which contribute to the timing information in the timing model of the module are only the combination circuits which are at the input or output stage, and the F/F circuits each of which adjoins the combination circuit located at the input or output stage. More specifically, internal circuit composition does not participate in the timing information.

In the case of the conventional timing model, each of the timing elements that compose each of the IN setup time (T201), IN hold time (T202), and OUT delay time (T203) is not defined as an independent element. Therefore, it is impossible to carve the time by or assign time to each element. For example, in case of the IN setup time (T201) shown in formula (1), the timing elements are the F/F 104 setup time (T204), combination circuit 106 delay time (T205), and F/F 104 clock delay time (T206).

Considering the above-mentioned conventional timing model, a notable feature of the timing model of this invention is that each of the clock delay times T206 and T210 of the F/Fs is defined as an independent element in formulae (1) to (3). In this way, since the clock delay information is provided as an option, the clock delay times T206 and T210 of the F/Fs can be freely added to or removed from the timing information.

In the first embodiment, the average delay time of all the flip flops concerning the timing information calculation is used as the clock delay information mentioned above. That is, the average delay time of the F/F 104 clock delay time (T206) and the F/F 105 clock delay time (T210) is defined independently as a module internal clock delay time (T307). Thereby, a common timing model can be applied with respect to the ideal clock conditions and the propagation clock conditions. Specifically, the timing model under the ideal clock conditions which does not use the clock delay information is defined as the first mode which can be represented by the following formulae (4) to (6). On the other hand, the timing model under the propagation clock conditions which uses the clock delay information is defined as the second mode which can be represented by the following formulae (7) to (9). Although the timing model itself is common to the first mode and the second mode, the modes differ by whether the clock delay time is included or not. By defining the clock delay time as an independent definition, a composition where a simple mode change on the ideal clock conditions and the propagation clock conditions is made possible. For example, it is a composition of setting up the mode as the option on a tool.

The formulae, which express the timing model in ideal clock conditions (the first mode), and the formulae, which express the timing model in propagation clock conditions (the 2nd mode), are shown blow. In the following formulae, T301 is Ideal clock IN setup time, T302 is Ideal clock IN hold time, T303 is Ideal clock OUT delay time, T304 is Propagation clock IN setup time, T305 is Propagation clock IN hold time, T306 is Propagation clock OUT time, and T307 is module internal clock delay time.

Ideal Clock Conditions (First Mode)

$$T301 = T204 + T205 \quad (4)$$

$$T302 = T207 - T205 \quad (5)$$

$$T303 = T208 + T209 \quad (6)$$

Propagation Clock Conditions (Second Mode)

$$T304 = T301 - T307 \quad (7)$$

$$T305 = T302 + T307 \quad (8)$$

$$T306 = T303 + T307 \quad (9)$$

Figure 2:
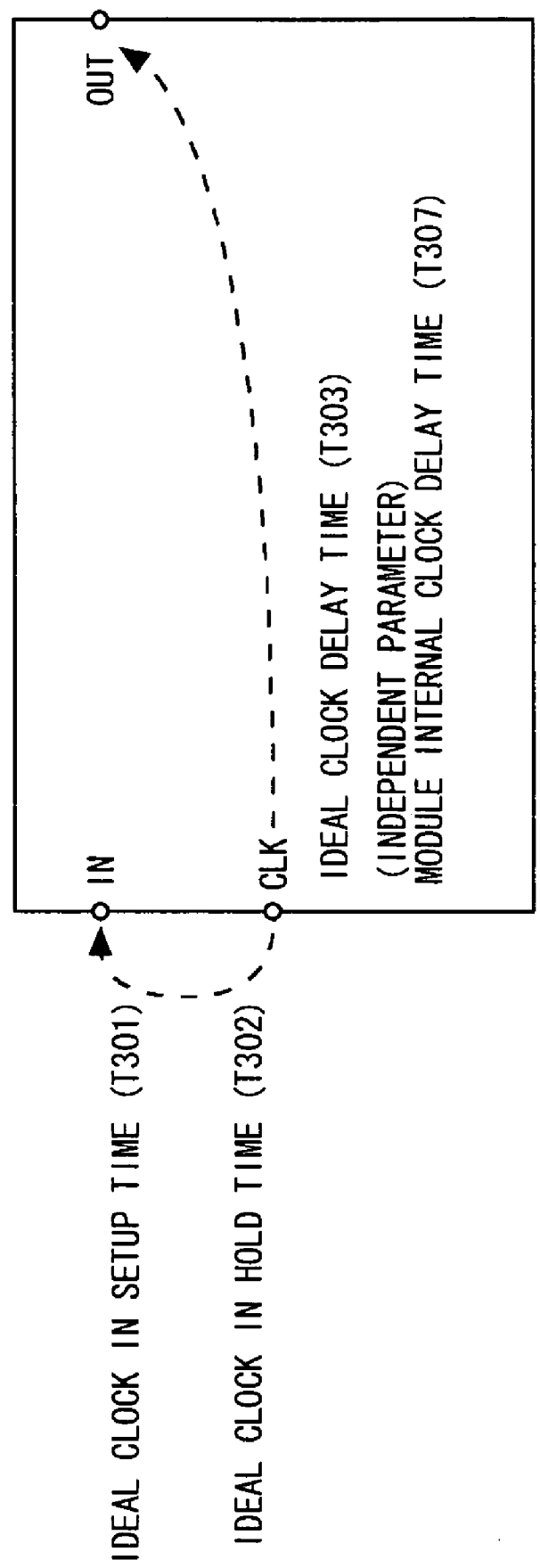
FIG. 2 is a schematic view of a timing model according to the first embodiment of the present invention.

FIG. 2 is a schematic view of the timing model according to the first embodiment of the present invention. As shown in FIG. 2, the timing model includes the ideal clock IN setup time (T301) and the ideal clock IN hold time (T302) from the CLK 102 to the IN 101. Moreover, the timing model includes the ideal clock OUT delay time (T303) and the module internal clock delay time (T307) from the CLK 102 to the OUT 103. Here, the module internal clock delay time (T307) is set up as an independent parameter.

Design Method

Figure 3:
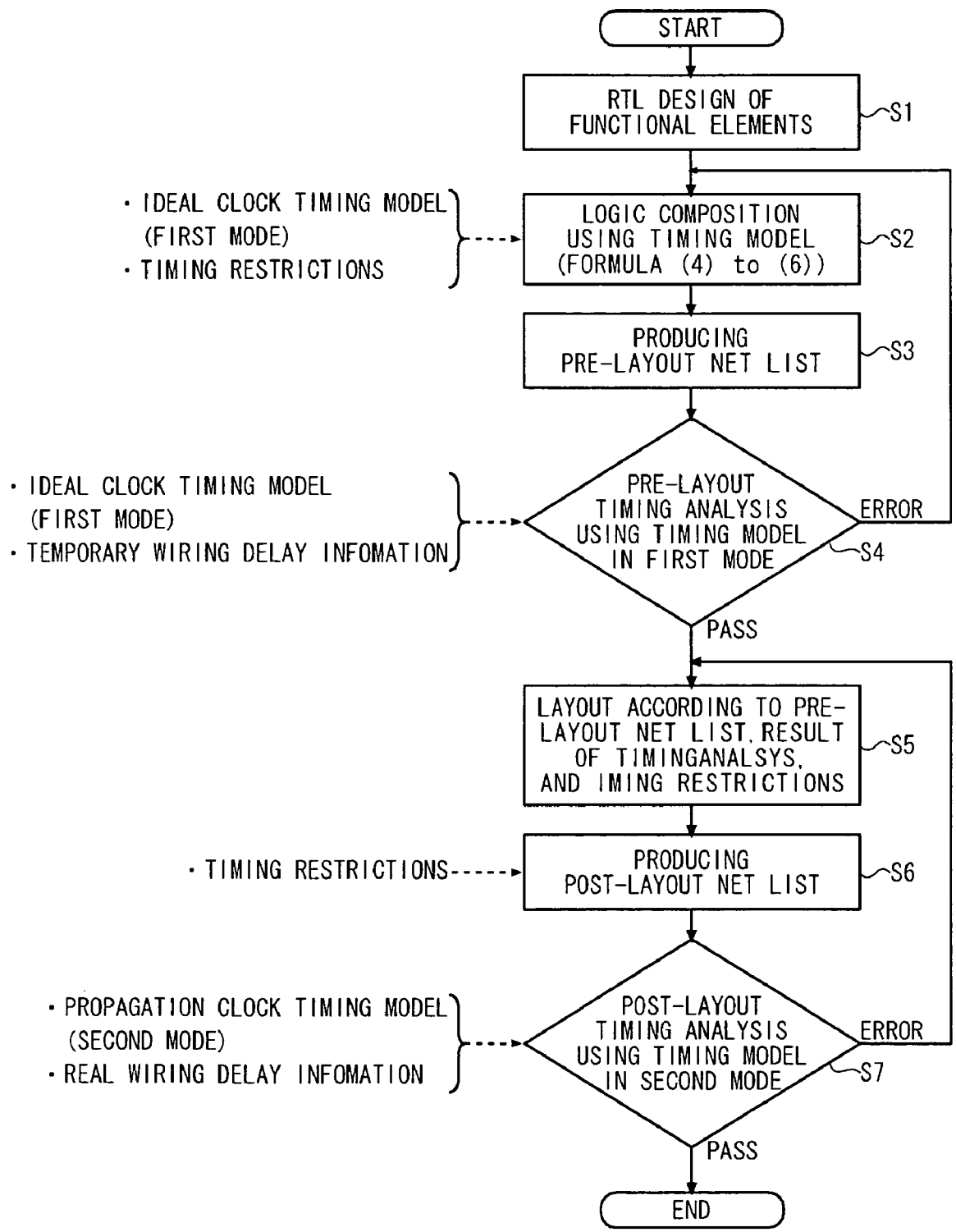
FIG. 3 is a flow chart describing a method of LSI designing according to the first embodiment of the present invention.

Now the outline of the LSI designing using a module and its timing model is described with reference to the flow chart shown in FIG. 3.

First, functional design (RTL design) of the functional elements containing the module, such as a CPU and a RAM, is performed (S1).

Second, with respect to the RTL-designed functional elements, logic composition is performed using the timing model (formulae (4) to (6)) in the first mode being set as the ideal clock conditions, and timing restrictions being specified separately (S2). Thereby, a pre-layout net list including parts information, wiring connection information, etc. is produced (S3). The net list is the text file of the circuit diagram outputted in list form.

Then with respect to the functional elements on which the logic composition has been performed, pre-layout timing analysis is performed using the timing model in the first mode set as the same ideal clock conditions (formula (4) to (6)) (S4). The timing analysis at this time is a static timing verification which does not use a test pattern. Moreover, since this is before layout is performed, the static timing verification is implemented using temporal wiring delay information.

When an error occurs in the pre-layout timing analysis (ERROR of step S4), the process returns to the step S2 and logic composition is performed again.

On the other hand, when the pre-layout timing analysis passes normally without an error (PASS of step S4), layout is performed according to the pre-layout net list, the result of the timing analysis, and the same timing restrictions as the time of the logic composition (S5). In the process of the layout, the module and other composition parts (cells) are first arranged based on the given timing restrictions. The candidates for arrangement here are the module and cells (F/F etc.), which need a clock. Then from the clock input of the functional element, a skew adjustment is preformed by carrying out clock tree synthesis (CTS) on the module and the cells which are the candidates for clock supply inside a functional element. Next, the cells (combination circuits), which do not need a clock, are arranged, then finally, timing is optimized.

After completion of the layout, a post-layout net list is produced as an output (S6).

Finally, post-layout timing analysis is carried out (S7), which is a static timing verification like the pre-layout timing analysis. However, the timing model used in this case is in the second mode being set as the propagation clock conditions (formulae (7) to (9)). Moreover, since the layout is completed, real wiring delay information is used as wiring delay information required for the analysis. This wiring delay information is acquired by the standard format called SDF (standard delay format). When an error occurs in the post-layout timing analysis (ERROR of step S7), the process returns to the step S5 and layout is performed again. On the other hand, when the post-layout timing analysis passes normally without error (PASS of step S7), the designing processing is ended.

The LSI designing method in the first embodiment is realized by performing a predetermined program.

Effect

According to the LSI designing method of the first embodiment of the present invention, the mode change between the first mode (ideal clock conditions) and the second mode (propagation clock conditions) can be performed simply, by having the module internal clock delay time (T307) defined as an independent element and arranged as an optional setup on a tool. Therefore, it is no longer necessary to prepare two kinds of timing models for the logic composition and pre-layout timing verification and the post layout timing verification. This leads to improvement on the design environment and design efficiency.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

ALTERNATE EMBODIMENTS

Alternate embodiments will now be explained. In view of the similarity between the first and alternate embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

Second Embodiment

Next, a second embodiment of the present invention will be described.

Module Composition

The module composition of the second embodiment is the same as the first embodiment.

Timing Model

The second embodiment uses the minimum delay time and the maximum delay time of all flip flops concerning timing information calculation of a functional block as the clock delay information inside the module, and sets clock delay conditions which could be the severest timing restrictions to the module exterior. Referring to FIG. 1, since F/F 104 and F/F 105 are all the flip flops and since they are involved in the timing information calculation in this embodiment, the clock delay time of one of the F/Fs will be equivalent to the minimum clock delay time, and the clock delay time of the other one will be equivalent to the maximum clock delay time. The minimum delay and the maximum delay are decided by the number of the buffers which exist in a physical layout, a clock path, or the like. Now, a minimum module internal clock delay time (T404) and a maximum module internal clock delay time (T405) are independently defined. Thereby, a common timing model can be applied with respect to the ideal clock conditions and the propagation clock conditions.

Specifically, the timing model under the ideal clock conditions, which does not use the clock delay information, is defined as the first mode which can be represented by the same formulae (4) to (6) as in the first embodiment. On the other hand, the timing model under the propagation clock conditions which uses the clock delay information is defined as the second mode which can be represented by the following formulae (10) to (12). By defining the clock delay time as an independent definition, a composition where a simple mode change on the ideal clock conditions and the propagation clock conditions is made possible. For example, it is a composition of setting up the mode as the option on a tool. In the following formulae, T401 represents a propagation clock IN setup time, T402 represents a propagation clock IN hold time, and T403 represents a propagation clock OUT delay time.

Ideal Clock Conditions (First Mode)

Formula (4) to (6) of the First Embodiment

Propagation Clock Conditions (Second Mode)

$$T401 = T301 - T404 \tag{10}$$

$$T402 = T302 + T405 \tag{11}$$

$$T403 = T303 + T405 \tag{12}$$

Here, the severest timing restrictions to the external circuit will be when each of the propagation clock IN setup time (T401), the propagation clock IN hold time (T402), and the propagation clock OUT delay time (T403) is at a maximum. According to formula (10), clock delay time is defined by a minus (−) in the calculation of the propagation clock IN setup time (T401). Therefore, the severest conditions will be realized if the clock delay time is minimized. That is, in this case, the minimum module internal clock delay time (T404) will be defined. On the other hand, according to formula (11) and formula (12), the clock delay time is defined by a plus (+) in the calculation of the propagation clock IN hold time (T402) and the propagation clock OUT delay time (T403). Therefore, the severest conditions will be realized if the clock delay time is maximized. That is, in both of these cases, the maximum module internal clock delay time (T405) is defined.

Figure 4:
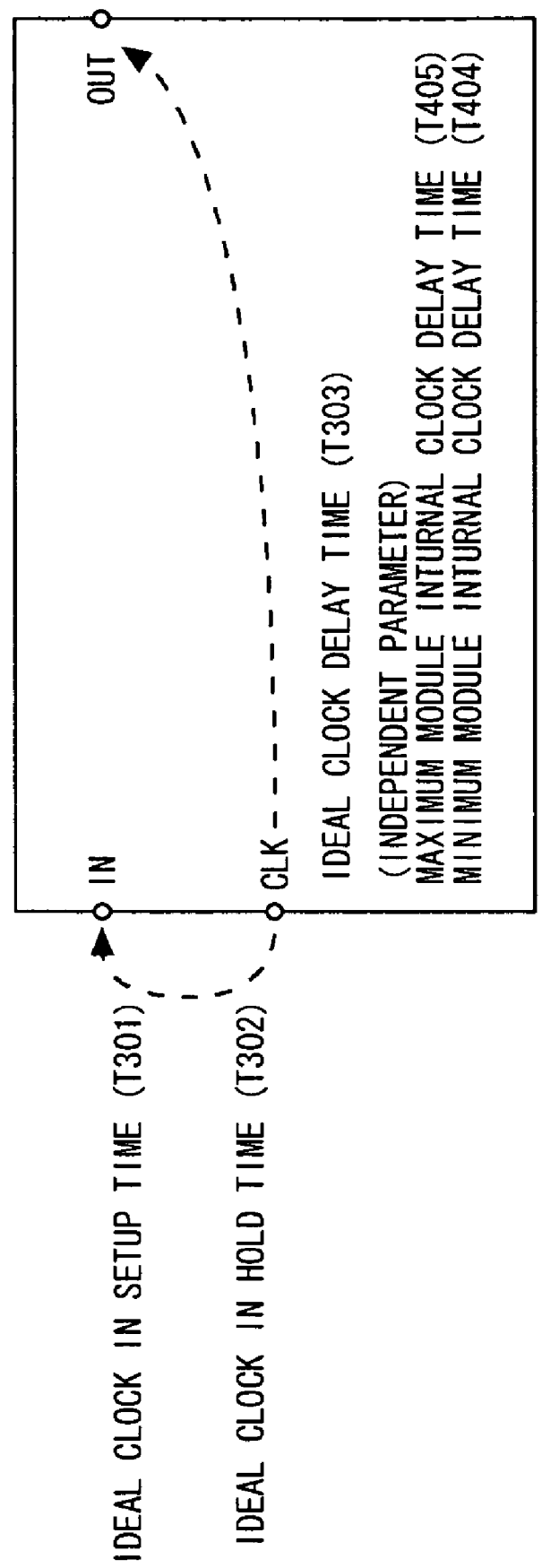
FIG. 4 is a schematic view of a timing model according to the second embodiment of the present invention.

FIG. 4 is a schematic view of the timing model according to the second embodiment of the present invention. As shown in FIG. 4, the timing model includes the ideal clock IN setup time (T301) and the ideal clock IN hold time (T302) from the CLK 102 to the IN 101. Moreover, the timing model includes the ideal clock delay time (T303), the maximum module internal clock delay time (T404), and the minimum module internal clock delay time (T405) from the CLK 102 to the OUT 103. Here, the minimum module internal clock delay time (T404) and the maximum module internal clock delay time (T405) are set up as independent parameters.

Design Method

The outline of the LSI designing in the second embodiment is mostly the same as the first embodiment as described with reference to FIG. 3, with the primary differences outlined below.

In the second embodiment as well, the logic composition (S1) and the pre-layout timing analysis (S4) are performed using the timing model in the first mode set as the ideal clock conditions (formulae (4) to (6)). On the other hand, the post-layout timing analysis (S7) is performed using the timing model in the second mode set as the propagation clock conditions (formulae (10) to (12)).

Effect

According to the LSI designing method of the second embodiment of the present invention, the mode change between the first mode (ideal clock conditions) and the second mode (propagation clock conditions) can be performed simply, by having each of the minimum module internal clock delay time (T404) and the maximum module internal clock delay time (T405) defined as an independent element and arranged as an optional setup on a tool. Therefore, it is no longer necessary to prepare two kinds of timing models for the logic composition and pre-layout timing verification, and the post layout timing verification. This leads to improvement on the design environment and design efficiency.

Furthermore, since the minimum clock delay time and the maximum clock delay time are used, no violation of timing occurs even in cases in which the minimum clock delay time and/or the maximum clock delay time are/is replaced by the real clock delay time. This is because the severest timing restrictions conditions are imposed to the circuits outside the module.

Third Embodiment

Next, a third embodiment of the present invention will be described.

Module Composition

The module composition of the third embodiment is the same as the first embodiment.

Timing Model

The third embodiment uses the delay time of each flip flop concerning timing information calculation of a functional block as the clock delay information inside the module. In other words, each of the F/F 104 clock delay time (T206) and F/F 105 clock delay time (T210) is independently defined as individual information. Thereby, a common timing model can be applied with respect to the ideal clock conditions and the propagation clock conditions.

Specifically, the timing model under the ideal clock conditions which does not use the clock delay information is defined as the first mode which can be represented by the same formulae (4) to (6) as in the first embodiment. On the other hand, the timing model under the propagation clock conditions which uses the clock delay information is defined as the second mode which can be represented by the following formulae (13) to (15). By defining the clock delay time as an independent definition, a composition where a simple mode change on the ideal clock conditions and the propagation clock conditions is made possible. For example, a composition of setting up the mode as an option on a tool is possible. In the following formula, T501 represents a propagation clock IN setup time, T502 represents a propagation clock IN hold time, and T503 represents a propagation clock OUT delay time.

Ideal Clock Conditions (First Mode)

Formulae (4) to (6) of the First Embodiment

Propagation Clock Conditions (Second Mode)

$$T501 = T301 - T206 \tag{13}$$

$$T502 = T302 + T206 \tag{14}$$

$$T503 = T303 + T210 \tag{15}$$

Figure 5:
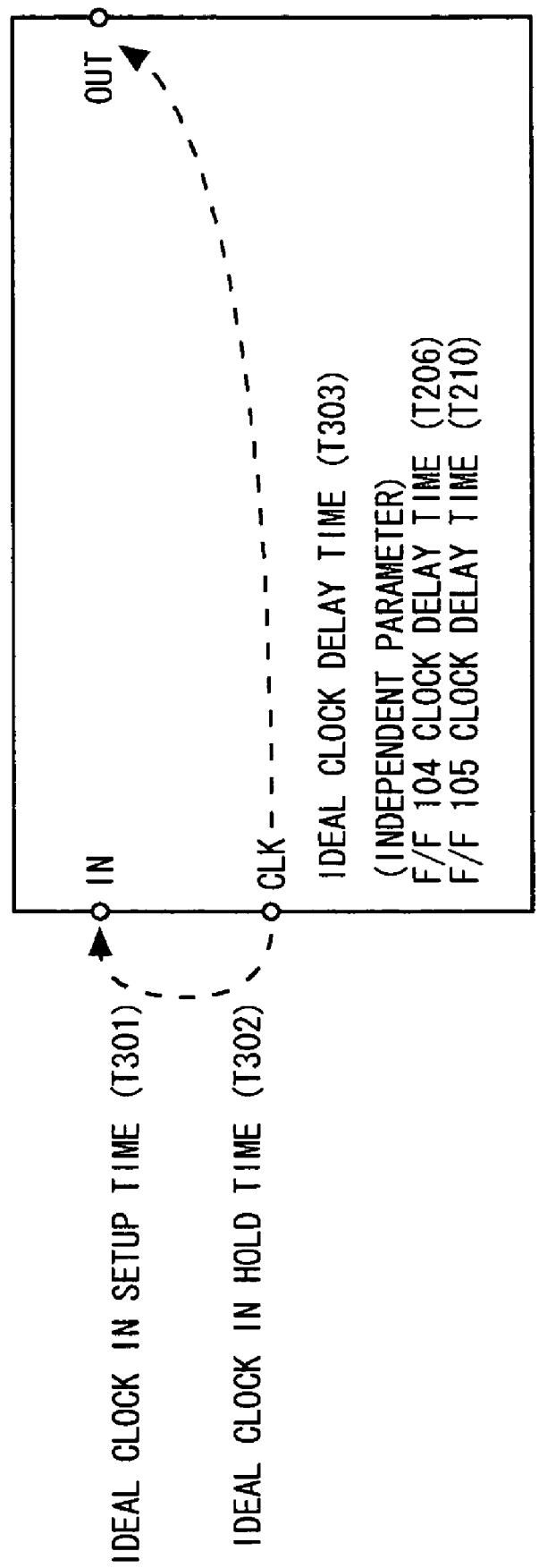
FIG. 5 is a schematic view of a timing model according to the third embodiment of the present invention.

FIG. 5 is a schematic view of the timing model according to the third embodiment of the present invention. As shown in FIG. 5, the timing model includes the ideal clock IN setup time (T301) and the ideal clock IN hold time (T302) from the CLK 102 to the IN 101. Moreover, the timing model includes the ideal clock delay time (T303), the F/F 104 clock delay time (T206), and the F/F 105 clock delay time (T210) from the CLK 102 to the OUT 103. Here, the F/F 104 clock delay time (T206) and the F/F 105 clock delay time (T210) are set up as independent parameters.

Design Method

The outline of the LSI designing in the third embodiment is mostly the same as the first embodiment as described with reference to FIG. 3, with the primary differences described below.

In the third embodiment as well, the logic composition (S1) and the pre-layout timing analysis (S4) are performed using the timing model in the first mode set as the ideal clock conditions (formulae (4) to (6)). On the other hand, the post-layout timing analysis (S7) is performed using the timing model in the second mode set as the propagation clock conditions (formula (13) to (15)).

Effect

According to the LSI designing method of the third embodiment of the present invention, the mode change between the first mode (ideal clock conditions) and the second mode (propagation clock conditions) can be performed simply, by having each clock delay time (T206/T210) of each of the flip flops inside the module defined as an independent element and arranged as an optional setup on a tool. Therefore, it is no longer necessary to prepare two kinds of timing models for the logic composition and pre-layout timing verification, and the post-layout timing verification. This leads to improvements in the design environment and design efficiency.

Furthermore, since each delay time of each flip flop is used, no violation of timing occurs even in cases in which the clock delay time of each flip flop is replaced by the real clock delay. This is because the timing restrictions are actually based. Moreover, according to the present invention, it is possible to prevent the design of the whole LSI from becoming more difficult or complex with excessive timing restrictions.

While the preferred embodiments of the invention have been described using specific terms, such description is for illustrative purposes only, and it is to be understood that changes and variations may be made without departing from the spirit or the scope of the following claims.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-190990. The entire disclosure of Japanese Patent Application No. 2004-190990 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An LSI designing method comprising:
preparing a timing model configured to be used under a first mode and a second mode;
performing a functional design of functional elements each including one or more functional blocks having at least two flip flops;
conducting logic composition using said timing model of said one or more functional blocks under said first mode with respect to said functional elements obtained by said functional design;
performing a first timing analysis using said timing model under said first mode with respect to said functional elements on which said logic composition of said timing model of said one or more functional blocks was conducted;
performing a layout based on a result of said logic composition and said first timing analysis; and
performing a second timing analysis using said timing model under said second mode subsequent to performing said layout,
wherein said timing model contains an independently defined clock delay time used only by said second mode, and
wherein said clock delay time is defined as an average delay time of all of said flip flops concerning timing information calculation of said one or more functional blocks.

2. A computer program for operating a computer to design an LSI using a timing model with respect to a functional block, comprising:
instructions for setting input setup time inside the functional block;
instructions for setting input hold time inside the functional block;
instructions for setting output delay time inside the functional block; and
instructions for setting clock delay time inside the functional block, the setting clock delay time process being independent of the setting input setup time, the setting input hold time, and the setting output delay time processes,
wherein said clock delay time is defined as an average delay time of all flip flops of the functional block concerning timing information calculation of the functional block.

3. An LSI functional block comprising:
a data input terminal being a first external point of contact;
a clock input terminal being a second external point of contact;
a data output terminal being a third external point of contact;
a first combination circuit being connected to said data input terminal;
a first flip flop being connected to said first combination circuit;
a first buffer being connected to said clock input terminal and said first flip flop;
a second combination circuit being connected to said first flip flop;
a second flip flop being connected to said second combination circuit;

a second buffer being connected to said clock input terminal and said second flip flop; and a third combination circuit being connected to said second flip flop and said data output terminal, said LSI functional block having, an input setup time being configured to be set inside said LSI functional block, an input hold time being configured to be set inside said LSI functional block, an output delay time being configured to be set inside said LSI functional block, and a clock delay time being configured to be set inside said LSI functional block and being independent of said input setup time, said input hold time, and said output delay time, wherein said clock delay time is defined as an average delay time of all flip flops of the LSI functional block concerning timing information calculation of the LSI functional block.

* * * * *